United States Patent
Ahn

(10) Patent No.: US 8,097,999 B2
(45) Date of Patent: Jan. 17, 2012

(54) PIEZOELECTRIC ACTUATOR

(75) Inventor: Doyeol Ahn, Seoul (KR)

(73) Assignee: University of Seoul Industry Cooperation Foundation, Seoul (KR)

( * ) Notice: Subject to any disclaimer, the term of this patent is extended or adjusted under 35 U.S.C. 154(b) by 126 days.

(21) Appl. No.: 12/430,371

(22) Filed: Apr. 27, 2009

(65) Prior Publication Data

US 2010/0270892 A1 Oct. 28, 2010

(51) Int. Cl.
*H01L 41/04* (2006.01)
*H01L 41/187* (2006.01)

(52) U.S. Cl. .................................................. 310/330

(58) Field of Classification Search ........... 310/330–332
See application file for complete search history.

(56) References Cited

U.S. PATENT DOCUMENTS

| | | | |
|---|---|---|---|
| 5,023,503 A | | 6/1991 | Legge et al. |
| 5,461,274 A | * | 10/1995 | Yuji et al. ....................... 310/330 |
| 5,798,540 A | | 8/1998 | Boos et al. |
| 5,994,821 A | * | 11/1999 | Imada et al. .................. 310/332 |
| 6,316,793 B1 | | 11/2001 | Sheppard et al. |
| 6,515,308 B1 | | 2/2003 | Kneissl et al. |
| 2002/0185655 A1 | | 12/2002 | Fahimulla et al. |
| 2003/0119220 A1 | * | 6/2003 | Mlcak et al. ..................... 438/52 |
| 2005/0230690 A1 | | 10/2005 | Hata |
| 2006/0121682 A1 | | 6/2006 | Saxler |
| 2007/0194354 A1 | | 8/2007 | Wu et al. |

FOREIGN PATENT DOCUMENTS

| | | |
|---|---|---|
| JP | 2005-277357 A | 10/2005 |
| KR | 1995-0007490 B1 | 7/1995 |
| KR | 10-0865740 B1 | 10/2008 |

OTHER PUBLICATIONS

Seoung-Hwan Park, et al., "Many-body optical gain of wurtzite GaN-based quantum-well lasers and comparison with experiment", Appl. Phys. Lett 72(3), Jan. 19, 1997, 287-289, 1998 American Institute of Physics.

Seoung-Hwan Park, et al., "Piezoelectric effects on electrical and optical properties of wurtzite GaN/AlGaN quantum well lasers", Appl. Phys Lett., vol. 72. No. 24, Jun. 15, 1998, 3103-3015, 1998 American Institute of Physics.

Seoung-Hwan Park, et al., "Many-body optical gain and intraband relaxation time of wurtzite InGaN/GaN quantum-well lasers and comparison with experiment", Appl. Phys. Lett. 87, Jul. 20, 2005, 044103-1-044103-3, , 2005 American Institute of Physics.

Seoung-Hwan Park, et al., Spontaneous and piezoelectric polarizntion effects in wurtzite ZnO/MgZnO quantum well lasers:, Appl. Phys. Lett. 87., Dec. 15, 2005, 253509-1-203509-3. 2005 American Institute of Physics.

Seoung-Hwan Park, et al., "Internal field engineering in CdZnO/MgZnO quantum well structures", , Appl. Phys. Lett 94, Feb. 27, 2009, 083507-1-083507-3, 2009 American Institute of Physics.

(Continued)

*Primary Examiner* — Derek Rosenau
(74) *Attorney, Agent, or Firm* — Maschoff Gilmore & Israelsen

(57) ABSTRACT

Piezoelectric actuators having a piezoelectric layer in which a cantilever portion is formed are disclosed. In one embodiment, an actuator includes a support layer and a piezoelectric layer. The piezoelectric layer may include a supported portion formed on the support layer and a cantilever portion which extends beyond the support layer.

12 Claims, 9 Drawing Sheets

OTHER PUBLICATIONS

Seoung-Hwan Park, et al., "Optical gain in InGaN/InGaAlN quantum well structures with zero internal field", Appl. Phys. Lett., 92, May 2, 2008, 171115-1-171115-3, 2008 American Institute of Physics.

Bradley. Et al.. "Space-charge effects in type-II strained layer superlattices", 1998, 728-731, Elsevier Science.

Liu, et al., "AlGaN/GaN/InGaN/GaN DH-HEMTs With an InGaN Notch for Enhanced Carrier Confinement", IEEE Electron Device Letters, vol. 27. No. 1., Jan. 2006, 10-12, 2005 IEEE.

Doyeol, et al., "Theory of Non-Markovian Gain in Strained-Layer Quantum-Well Lasers with Many-Body Effects", IEE Journal of Quantum Electronics, vol. 34. No. 2. Feb. 1998, 344-352, 2005 IEEE.

D. Ahn, et al., "Optical Gain and Luminescence of a ZnO-MgZnO Quantum Well", IEEE Photonics Technology Letters, vol. 18. No. 2., Jan. 15, 2006, 349-351, 2005 IEEE.

Doyeol Ahn "Non-Markovian Gain of Strained-Layer Wurtzite GaN Quantum-Well Lasers with Many-Body Effects", IEEE Journal of Selected Topics in Quantum Electronics. vol. 4, No. 3, May/Jun. 1998, 520-526, 1998 IEEE.

Yifei Zhang, et al., "Charge control and mobility studies for an AlGaN/GaN high electron mobility transistor", Journal of Applied Physics, vol. 85, No. 1. Jan. 1, 1999, 587-594, 1999 American Institute of Physics.

Tsung-Hsing Yu, et al., "Theoretical study of the two-dimensional electron mobility in strained III-nitride heterostructures", Journal of Applied Physics, vol. 89, No. 7, Apr. 1, 2001, 3827-3833, 2001 American Institute of Physics.

Seoung-Hwan Park, "Crystal Orientation Effects on Electronic Properties of Wurtzite GaN/AlGaN Quantum Wells with Spontaneous and Piezoelectric Polarization", Jpn. J. Appl. Phys. vol. 39., Jun. 2000, 3478-3482, 2000 The Japan Society of Applied Phtsics.

P. Waltereit, et al., "Nitride semiconductors free of electrostatic fields for efficient white light-emitting diodes", Nature vol. 406, Aug. 24, 2000, 865-868, 2000 Macmillan Magazines Ltd.

D. Ahn, et al., "Electric field dependence of intrasubband polar-optical-phonon scattering in a quantum well", Physical Review B, Feb. 15, 1988, 2529-2535, 1998 The American Physical Society.

Doyeol Ahn, "Time-convolutionless reduced-density-operator theory of an arbitrary driven system coupled to a stochastic reservoir: Quantum kinetic equations for semiconductors", Physical Review B, Sep. 15, 1994, 8310-8318, 1994 The American Physical Society.

Doyeol Ahn, "Time-convolutionless reduced-density-operator theory of an arbitrary driven system coupled to a stochastic reservoir. II . Optical gain and line-shape function of a driven semiconductor", Physical Review B. Jan. 15, 1995, 2159-2166, 1995 The American Physical Society.

Seoung-Hwan Park, et al., "Crystal-Orientation effects on the piezoelectric field and electronic properties of strained wurtzite semiconductors", Physical Review B, Feb. 15, 1999, 4725-4737, 1999 The Japan Society of Applied Phtsics.

Zimmerman et al., Piezoelectric GaN Sensor Structures, IEEE Electron Device Letters, vol. 27, No. 5, pp. 309-312, May 5, 2006.

Davies et al., Fabrication of GaN Cantilevers on Silicon Substrates for Microelectromechanical Devices, Applied Physics Letters, vol. 84, No. 14, pp. 2566-2568, Apr. 5, 2004.

Chu et al., Piezoelectric Polarization-Induced Two Dimensional Electron Gases in AlGaN/GaN Heteroepitaxial Structures: Application for Micro-Pressure Sensors, Materials Science and Engineering A, vol. 409, pp. 340-347, Nov. 2005.

Crosslight Software Inc., "BeamXpress," Newsletter, Mar. 2000, 1-12, Issue No. 2000.3, Crosslight Software Inc., www.crosslight.com.

A.D. Andreev et al., "Strain distributions in quantum dots of arbitrary shape," Journal of Applied Physics, vol. 86, No. 1, Jul. 1, 1999, pp. 297-305.

P. H. Dederichs, "Elastic Green's Function for Anisotropic Cubic Crystals," Physical Review, vol. 188, No. 3, Dec. 15, 1969, pp. 1175-1183.

International Search Report and Written Opinion, mailed Aug. 25, 2010, as issued in connection with Patent Application No. PCT/KR2010/002648 filed on Apr. 27, 2010.

International Search Report and Written Opinion, mailed Aug. 26, 2010, as issued in connection with Patent Application No. PCT/KR2010/002652, filed on Apr. 27, 2010.

* cited by examiner

PIEZOELECTRIC ACTUATOR

BACKGROUND

Piezoelectric actuators are transducers that convert electrical energy into a mechanical displacement or stress using a piezoelectric effect. Piezoelectric elements possess good responsiveness and conversion efficiency when converting electrical energy to mechanical energy. Recently, various types of piezoelectric actuators, which use piezoelectric elements and their piezoelectric effects, have been developed. Moreover, these piezoelectric actuators have been implemented in products such as piezoelectric buzzers, inkjet buzzers, inkjet heads of printers, ultrasonic motors, and microelectromechanical systems (MEMS).

SUMMARY

In one embodiment, an actuator includes a support layer and a piezoelectric layer. The piezoelectric layer may include a supported portion formed on the support layer and a cantilever portion which extends beyond the support layer. The piezoelectric layer may include a lower semiconductor layer and an upper semiconductor layer formed on the lower semiconductor layer, where a portion of the lower and upper semiconductor layers form the supported portion, and another portion of the lower and upper semiconductor layers form the cantilever portion. A composition of at least one of the lower and upper semiconductor layers may be adjusted to reduce an internal polarization field in the piezoelectric layer.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
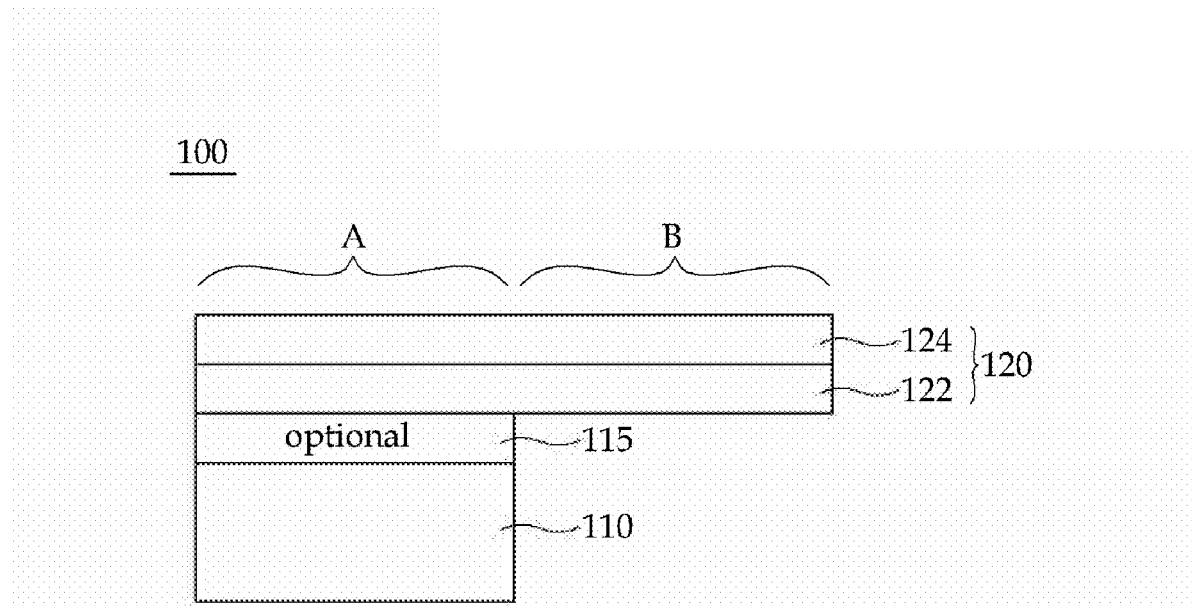
FIG. 1 is a schematic diagram of an illustrative embodiment of a piezoelectric actuator.

In some embodiments, an actuator includes a support layer, and a piezoelectric layer having a supported portion formed on the support layer and a cantilever portion which extends beyond the support layer. The piezoelectric layer may include a lower semiconductor layer and an upper semiconductor layer formed on the lower semiconductor layer, where a portion of the lower and upper semiconductor layers form the supported portion, and another portion of the lower and upper semiconductor layers form the cantilever portion. The composition of at least one of the lower and upper semiconductor layers may be adjusted to reduce an internal polarization field in the piezoelectric layer.

The actuator may optionally include one or more electrodes disposed on either side of the piezoelectric layer or both sides of the piezoelectric layer. The actuator may optionally include a strain relieving layer that is in contact with the piezoelectric layer.

The lower and upper semiconductor layers may form a heterostructure. Each of the lower and upper semiconductor layers may be composed of a III-V group compound semiconductor material, a II-VI group compound semiconductor material, or a I-VII group compound semiconductor material. Each of the lower and upper semiconductor layers may be selected from GaN, InGaN, AlN, AlP, AlAs, GaP, GaAs, InN, InP, InAs, AlGaN, AlGaP, AlGaAs, InGaN, InGaP, InGaAs, InAlN, InAlP, InAlAs, AlGaInN, AlGaInP, AlGaInAs, ZnO, ZnS, CdO, CdS, CdZnS, CdZnO, MgZnO, MgZnS, CdMgZnO, CdMgZnS, CuF, CuBr, CuCl, CuI, CuFBr, CuFCl, CuFI, CuBrCl, CuBrI, CuClI, CuFBrCl, CuFBrI, CuFClI, CuBrClI, AuF, AuBr, AuCl, AuI, AuFBr, AuFCl, AuFI, AuBrCl, AuBrI, AuClI, AuFBrCl, AuFBrI, AuFClI, AuBrClI, AgF, AgBr, AgCl, AgI, AgFBr, AgFCl, AgFI, AgBrCl, AgBrI, AgClI, AgFBrCl, AgFBrI, AgFClI, or AgBrClI.

The strain relieving layer may be composed of AlGaInN, InGaN, AlGaN, AlGaP, AlGaAs, InGaN, InGaP, InGaAs, InAlN, InAlP, InAlAs, AlGaInP, AlGaInAs, CdZnS, CdZnO, MgZnS, MgZnO, CdMgZnO, CdMgZnS, CuFBr, CuFCl, CuFI, CuBrCl, CuBrI, CuClI, CuFBrCl, CuFBrI, CuFClI, CuBrClI, AuFBr, AuFCl, AuFI, AuBrCl, AuBrI, AuClI, AuFBrCl, AuFBrI, AuFClI, AuBrClI, AgFBr, AgFCl, AgFI, AgBrCl, AgBrI, AgClI, AgFBrCl, AgFBrI, AgFClI, or AgBrClI.

The upper semiconductor layer may be composed of $In_xGa_{1-x}N$ ($0 \leq x \leq 1$), and the lower semiconductor layer may be composed of $AlGa_{1-y}In_yN$ ($0 \leq y \leq 1$). In composition (x) of the upper semiconductor layer may be in the range of about 0 and 0.30, and In composition (y) of the lower semiconductor layer may be in the range of about 0.01 and 0.30.

The upper semiconductor layer may be composed of $Cd_xZn_{1-x}O$ ($0 \leq x \leq 1$), and the lower semiconductor layer may be composed of $Mg_yZn_{1-y}O$ ($0 \leq y \leq 1$). Cd composition (x) of the upper semiconductor layer may be in the range of about 0 and 0.20, and Mg composition (y) of the lower semiconductor layer may be in the range of about 0.01 and 0.80.

The thickness of the upper and lower semiconductor layers each may be in the range of about 0.1 nm and 300 nm The piezoelectric layer may be deflectable as a result of an applied electric or magnetic field.

The actuator may be implemented in a sensor.

In another embodiment, a method for fabricating an actuator is provided. The method includes forming a support layer, and forming a piezoelectric layer on the support layer such that one portion of the piezoelectric layer is supported by the support layer, and another portion of the piezoelectric layer extends beyond the support layer. The method also includes controlling a composition of the piezoelectric layer to reduce an internal polarization field in the piezoelectric layer.

The piezoelectric layer may be formed by forming a lower semiconductor layer on the support layer, and forming an upper semiconductor layer having a wider band gap than that of the lower semiconductor layer on the lower semiconductor layer.

The lower and upper semiconductor layers can each be formed by depositing a III-V group compound semiconductor material, a II-VI group compound semiconductor material, or a I-VII group compound semiconductor material on the support layer and the lower semiconductor layer, respectively.

One or more electrodes may be formed on either side of the piezoelectric layer or both sides of the piezoelectric layer.

In the following detailed description, reference is made to the accompanying drawings, which form a part hereof In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

Figure 2:
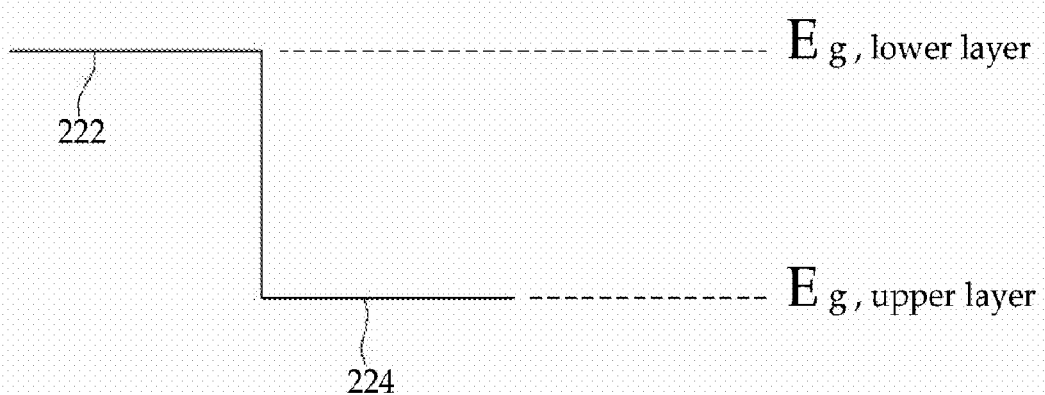
FIG. 2 is a schematic diagram showing band gaps of the piezoelectric actuator of FIG. 1

With reference to FIGS. 1 and 2, an actuator, for example, a piezoelectric actuator, in accordance with the present disclosure will now be described. FIG. 1 is a schematic diagram of an illustrative embodiment of a piezoelectric actuator. FIG. 2 is a schematic diagram showing band gaps of the piezoelectric actuator of FIG. 1

As depicted in FIG. 1, a piezoelectric actuator 100 includes a support layer 110, and a piezoelectric layer 120 disposed on support layer 110. Piezoelectric layer 120 includes a supported portion "A" formed on support layer 110 and a cantilever portion "B" extending beyond support layer 110. Cantilever portion "B" of piezoelectric layer 120 is movable in the plane of support layer 110, and is freely deflected, for example, in response to a force applied to cantilever portion "B," as will be described below.

Support layer 110 may be composed of a III-V group, a II-VI group, or a I-VII group compound semiconductor material. III-V group compound semiconductor materials include, without limitation, aluminum nitride (AlN), Gallium nitride (GaN), or aluminum Gallium nitride (AlGaN). II-VI group compound semiconductor materials include, without limitation, ZnO, or MgZnO. I-VII group compound semiconductor materials include, without limitation, CuCl, CuBr, or CuI. However, support layer 110 may include any compound semiconductor material which has a lattice constant substantially matched to a lattice constant of piezoelectric layer 120.

In some embodiments, a strain relieving layer 115 may optionally be disposed between support layer 110 and piezoelectric layer 120 to reduce the strain in piezoelectric layer 120. Strain relieving layer 115 may include any compound semiconductor material which has a medium band gap between band gaps of piezoelectric layer 120 and support layer 110. For example, strain relieving layer 115 may include a III-V group compound semiconductor material, such as AlGaN, AlGaP, AlGaAs, InGaN, InGaP, InGaAs, InAlN, InAlP, InAlAs, AlGaInN, AlGaInP, or AlGaInAs. Further, strain relieving layer 115 may include a I1-VI group compound semiconductor material, such as CdZnS, CdZnO, MgZnO, MgZnS, CdMgZnO, or CdMgZnS, or a I-VII group compound semiconductor material, such as CuFBr, CuFCl, CuFI, CuBrCl, CuBrI, CuCII, CuFBrCl, CuFBrI, CuFCII, CuBrCII, AuFBr, AuFCl, AuFI, AuBrCl, AuBrI, AuCl, AuFBrCl, AuFBrI, AuFCII, AuBrCII, AgFBr, AgFCl, AgFI, AgBrCl, AgBrI, AgCII, AgFBrCl, AgFBrI, AgFCII, or AgBrCII. However, strain relieving layer 115 is not limited to these listed materials.

Piezoelectric layer 120 may include a lower semiconductor layer 122 and an upper semiconductor layer 124 disposed on lower semiconductor layer 122. Lower and upper semiconductor layers 122 and 124 may each include a III-V group compound semiconductor material, a II-VI group compound semiconductor material, or a I-VII group compound semiconductor material. III-V group compound semiconductor materials for lower and upper semiconductor layers 122 and 124 include, without limitation, GaN, AlN, AlP, AlAs, GaP, GaAs, InN, InP, InAs, AlGaN, AlGaP, AlGaAs, InGaN, InGaP, InGaAs, InAlN, InAlP, InAlAs, AlGaInN, AlGaInP, or AlGaInAs. II-VI group compound semiconductor materials for lower and upper semiconductor layers 122 and 124 include, without limitation, ZnO, ZnS, CdO, CdS, CdZnS, CdZnO, MgZnO, MgZnS, CdMgZnO, or CdMgZnS. I-VII group compound semiconductor materials for lower and upper semiconductor layers 122 and 124 include, without limitation, CuF, CuBr, CuCl, CuI, CuFBr, CuFCl, CuFI, CuBrCl, CuBrI, CuCII, CuFBrCl, CuFBrI, CuFCII, or CuBrCII. Alternatively, I group elements, such as Au or Ag can be replaced with Cu of the aforementioned examples of I-VII group compound semiconductor materials. At least one of lower semiconductor layer 122 and upper semiconductor layer 124 of piezoelectric layer 120 can be a ternary or a quaternary compound semiconductor material.

In some embodiments, lower semiconductor layer 122 is selected to have a band gap (e.g., band gap 222) that is wider than a band gap 224 of upper semiconductor layer 124. In another embodiment, lower semiconductor layer 122 is selected to have a band gap that is narrower than a band gap of upper semiconductor layer 124. For clarification and ease of description, lower semiconductor layer 122 is assumed to have a wider band gap 222 than that 224 of upper semiconductor layer 124, as depicted in FIG. 2, thereby forming a band gap difference between lower semiconductor layer 122 and upper semiconductor layer 124. A structure of piezoelectric layer 120 having the difference between band gap 224 ($E_{g,\ upper\ layer}$) of upper semiconductor layer 124 and band gap 222 ($E_{g,\ lower\ layer}$) of lower semiconductor layer 122 can be referred as a heterostructure. Cantilever portion B of piezoelectric layer 120 having a heterostructure can be deflected in response to a force applied to cantilever portion B, such as an electric or magnetic field. Here, $E_g$ indicates $E_c$–$E_v$, where $E_c$ refers to an energy level at a conduction band of semiconductor layers (e.g., lower semiconductor layer 122 and upper semiconductor layer 124), and $E_v$ refers to an energy level at a valence band of the semiconductor layers.

In some embodiments, a third semiconductor layer (not shown) may optionally be disposed on upper semiconductor layer 124. The third semiconductor layer may be composed of a III-V group, a II-VI group, or a I-VII group compound semiconductor material, and has a band gap that is wider or narrower than that of upper semiconductor layer 124 such that the mechanical displacement due to the piezo-effect is maximized.

Figure 3:
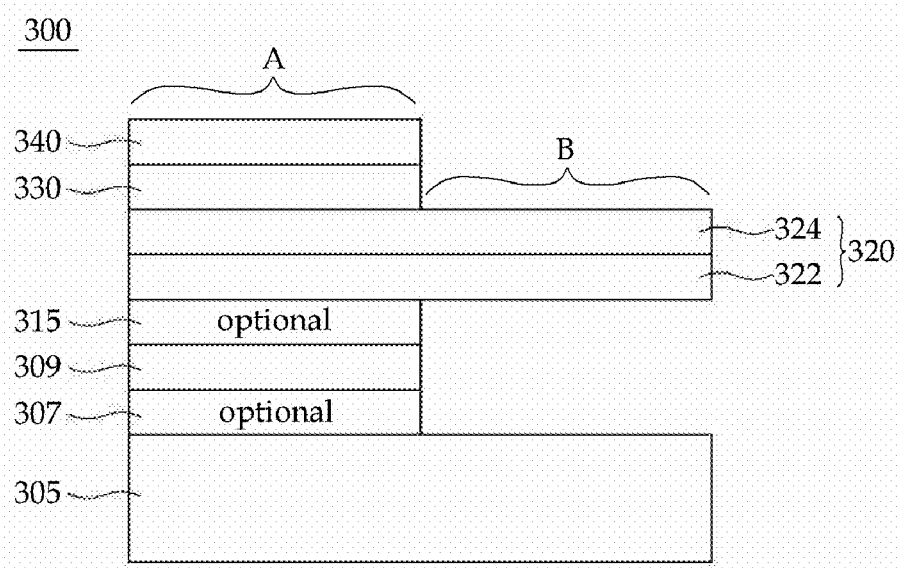
FIG. 3 is a schematic diagram of another illustrative embodiment of a piezoelectric actuator.
Figure 4:
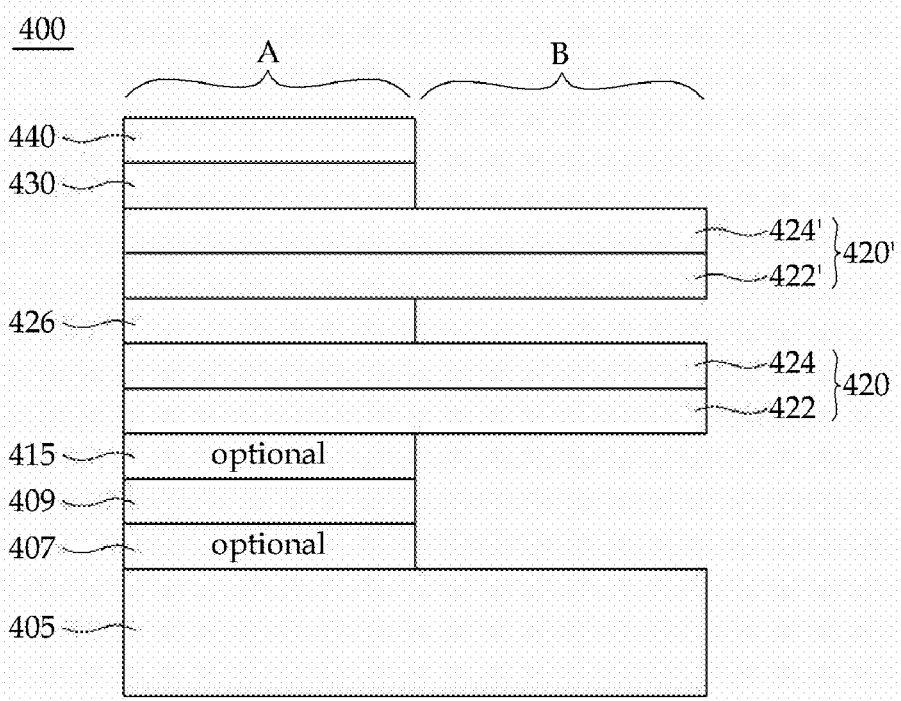
FIG. 4 is a schematic diagram of still another illustrative embodiment of a piezoelectric actuator.

FIG. 3 is a schematic diagram of another illustrative embodiment of a piezoelectric actuator having at least one electrode. FIG. 4 is a schematic diagram of still another illustrative embodiment of a piezoelectric actuator having a multiple number of piezoelectric layers.

As depicted in FIG. 3, a sacrificial layer 307 (which is optional) is disposed on a substrate 305. Substrate 305 may be composed of, for example, c-face (0001) or a-face (1120) oriented sapphire ($Al_2O_3$), silicon carbide (SiC), aluminum nitride (AlN), aluminum gallium nitride (AlGaN), gallum nitride (GaN), silicon (Si), or spinel ($MgAl_2O_4$). Sacrificial layer 307 facilitates detachment of substrate 305 from other layers of actuator 300. Sacrificial layer 307 may be composed of material, such as aluminum nitride (AlN) which can be selectively etched with respective to the other layers. A support layer 309 may be disposed on sacrificial layer 307. Suitable materials for support layer 309 may be substantially the same as described above for support layer 110. Support layer 309 may provide an appropriate crystalline transition between sacrificial layer 307 and other layers of actuator 300 which are disposed on support layer 309, or between substrate 305 (in cases where actuator 300 includes no sacrificial layer 307) and other layers of actuator 300 which are disposed on support layer 309.

In some embodiments, a strain relieving layer 315 may optionally be disposed between support layer 309 and a piezoelectric layer 320 to be disposed on strain relieving layer 315. Strain relieving layer 315 can be selected to have a narrower band gap than that of piezoelectric layer 320. Suitable materials for strain relieving layer 315 are substantially the same as the materials described above for strain relieving layer 115.

Piezoelectric layer 320 is disposed on strain relieving layer 315. Piezoelectric layer 320 may include a lower semiconductor layer 322 and an upper semiconductor layer 324. Suitable materials for lower and upper semiconductor layers 322 and 324 are substantially the same as the materials described above for lower and upper semiconductor layer 122 and 124, respectively. Piezoelectric layer 320 has a supported portion "A" supported by support layer 309 and a cantilever portion "B" extending over support layer 309. An insulating layer 330 is disposed on piezoelectric layer 320, and an electrode 340 is disposed on insulating layer 330. Insulating layer 330 and electrode 340 may cover supported portion "A" of piezoelectric layer 320 while uncovering cantilever portion "B" of piezoelectric layer 320. Insulating layer 330 includes, without limitation, silicon oxide, silicon nitride, a III group nitride compound semiconductor material, such as gallium nitride (GaN) or aluminum gallium nitride (AlGaN), or a II-V group compound semiconductor material, such as ZnO or MgZnO. Electrode 340 includes, without limitation, titanium (Ti), aluminum (Al), nickel (Ni), aurum (Au), or alloys thereof In some embodiments, another electrode may be disposed under piezoelectric layer 320 with another insulating layer disposed therebetween.

In another embodiment, a piezoelectric actuator 400 may include at least two piezoelectric layers (e.g., a first piezoelectric layer 420 and a second piezoelectric layer 420'). As depicted in FIG. 4, first piezoelectric layer 420 can be disposed on a first support layer 409 which is disposed on a substrate 405. A first sacrificial layer 407 may optionally be disposed between substrate 405 and first support layer 409. A first strain relieving layer 415 may optionally be disposed between first support layer 409 and first piezoelectric layer 420. First sacrificial layer 407, first support layer 409, and first strain relieving layer 415 are disposed on substrate 405, such that a supported portion "A" of first piezoelectric layer 420 is supported by first sacrificial layer 407, first support layer 409, and first strain relieving layer 415, and the other portion (cantilever portion) "B" of first piezoelectric layer 420 extends over first sacrificial layer 407, first support layer 409, and first strain relieving layer 415. A second piezoelectric layer 420' can be disposed on first piezoelectric layer 420 with a second support layer 426 disposed therebetween. Second support layer 426 is disposed to cover supported portion "A" of first piezoelectric layer 420. Thus, like in first piezoelectric layer 420, a supported portion "A" of second piezoelectric layer 420' is supported by second support layer 426, and the other portion (cantilever portion) "B" of second piezoelectric layer 420' extends over second support layer 426. On second piezoelectric layer 420', an insulating layer 430 and an electrode 440 can be disposed to cover the supported portion "A" of second piezoelectric layer 420' while uncovering the cantilever portion "B" of second piezoelectric layer 420', In other embodiments, another electrode can be disposed under first piezoelectric layer 420 with an insulating layer disposed therebetween.

Each of first and second piezoelectric layers 420 and 420' has a lower semiconductor layer (e.g., a first lower semiconductor layer 422, and a second lower semiconductor layer 422'), and an upper semiconductor layer (e.g., a first upper semiconductor layer 424, and a second upper semiconductor layer 424') First and second lower semiconductor layers 422 and 422' have band gaps wider than those of first and second upper semiconductor layers 424 and 424' respectively. Suitable materials for first lower semiconductor layer 422 and second lower semiconductor layer 422' are substantially the same as the materials described above for lower semiconductor layer 122, and suitable materials for first upper semiconductor layer 424 and a second upper semiconductor layer 424' are substantially the same as the materials described above for upper semiconductor layer 124.

In another embodiment, actuator 400 may include further piezoelectric layers on second piezoelectric layer 420'. For example, a third piezoelectric layer (not shown) may be disposed on second piezoelectric layer 420' with a third support layer disposed therebetween. Actuator 400 is illustrated to include two piezoelectric layers 420 and 420' stacked in a perpendicular direction with respect to a plane of substrate 405. In another embodiment, however, a plurality of the piezoelectric layers can be disposed on the same plane of substrate 405.

Figure 5:
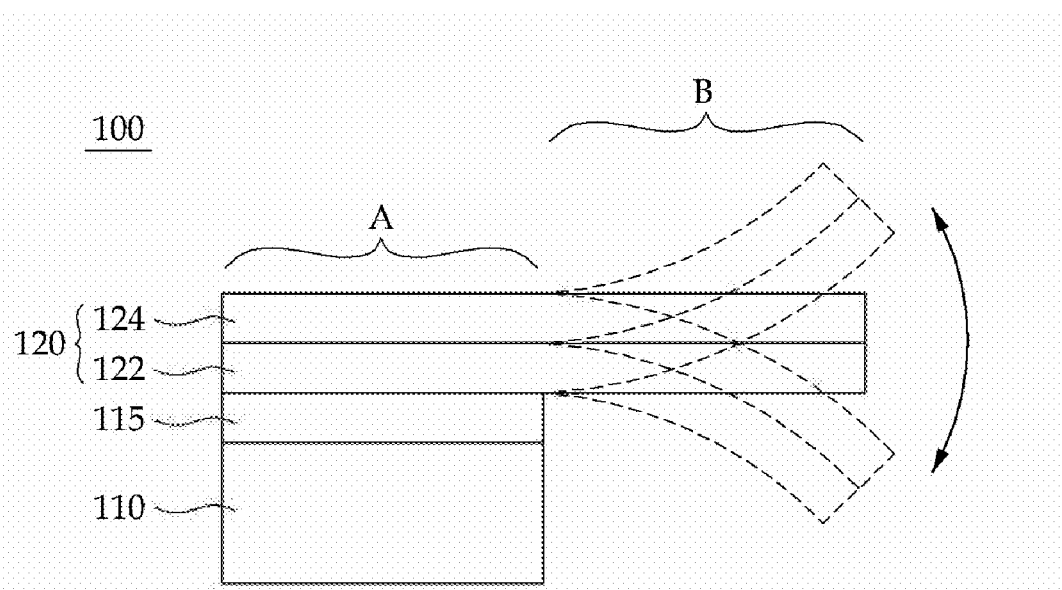
FIG. 5 is a schematic diagram showing a deflection of the piezoelectric actuator of FIG. 1.

Piezoelectric layers 100, 300, or 400 can display a deflection in response to a force applied to cantilever portion "B" of piezoelectric layer 120, 320, 420, or 420'. FIG. 5, for example, shows piezoelectric actuator 100 displaying a deflection in response to the force applied to cantilever portion "B" of piezoelectric layer 120. The force can be a magnetic field surrounding piezoelectric actuator 100. However, the force may be an electric field generated by an external device (not shown). In the case of piezoelectric layers 300 or 400, the electric field may be generated by electrode 340 or 440.

As depicted in FIG. 5, in response to the magnetic field or the electric field applied to piezoelectric actuator 100, a lattice displacement is formed in piezoelectric layer 120. Accordingly, cantilever portion "B" of piezoelectric layer 120, which is not supported by support layer 110 but is free to vibrate, displays a deflection, as indicated by an arrow shown in FIG. 5, by the lattice displacement. Thus, by detecting the deflection of actuator 100 whether any magnetic field or any electric field exists around actuator 100 can be determined. Further, by measuring the range or direction of the deflection, the size or direction of the applied force may be further determined.

However, the existence of the magnetic or electric field may not be accurately detected due to a polarization field internally generated in the heterostructure of piezoelectric layer 120. Particularly, piezoelectric layer 120 has an internal polarization field which is composed of a piezoelectric polarization and a spontaneous polarization. The piezoelectric polarization is generated in response to strain, and the strain is formed due to a lattice displacement. Because piezoelectric layer 120 has the internal polarization field, cantilever portion "B", which is not supported by support layer 110, can be deflected even if no electric or magnetic field surrounds actuator 100. Thus, the deflection of cantilever portion "B" may be caused by the existence of the electric or magnetic field, the internal polarization field, or both the fields.

Thus, in order to accurately detect the existence of the electric or magnetic field only, the internal polarization field in piezoelectric layer 120 is controlled to be zero in the present disclosure. For example, the composition of at least one of lower and upper semiconductors 122 and 124 of piezoelectric layer 120 is controlled in order to reduce the internal polarization field, thereby improving the sensibility of piezoelectric actuator 100, as now be described.

An internal polarization field $F_z^u$ in upper semiconductor layer 124 of piezoelectric layer 120 includes spontaneous and piezoelectric polarizations. The piezoelectric polarization refers to a polarization that arises from the electric potential generated in response to applied mechanical stress such as strain of a layer. The spontaneous polarization refers to a polarization that arises in ferroelectrics without external electric field. Although piezoelectric polarization can be reduced by reduction of the strain, the spontaneous polarization remains in upper semiconductor layer 124. For additional detail on the internal polarization field, see Ahn et al., "Spontaneous and piezoelectric polarization effects in wurtzite ZnO/MgZnO quantum well lasers", Appl. Phys. Lett. Vol. 87, p. 253509(2005), which is incorporated by reference herein in its entirety.

Internal polarization field $F_z^u$ can be determined from the difference between the sum of a spontaneous polarization $P_{SP}$ and a piezoelectric polarization $P_{PZ}$ in upper semiconductor layer 124 and the sum of spontaneous polarization $P_{SP}$ and piezoelectric polarization $P_{PZ}$ in lower semiconductor layer 122, as represented by Equation (1).

$$F_Z^U = [(P_{SP}^l + P_{PZ}^l) - (P_{SP}^u + P_{PZ}^u)]/(\in^u + \in^l L_u/L_l) \quad \text{Equation (1)}$$

where P is the polarization, the superscripts u and l denote upper and the lower semiconductor layers 124 and 122 respectively, L is the thickness of upper and lower semiconductor layers 124 and 122, and $\in$ is a static dielectric constant.

In accordance with one example, internal polarization field $F_z^u$ can have a value of zero by making the sum $(P_{SP}^l + P_{PZ}^l)$ of spontaneous and piezoelectric polarizations at lower semiconductor layer 122 and the sum $(P_{SP}^u + P_{PZ}^u)$ of spontaneous and piezoelectric polarizations at upper semiconductor layer 124 the same. For example, this can be achieved by controlling the mole fractions of the compounds of lower semiconductor layer 122, with respect to upper semiconductor layer 124.

Figure 6:
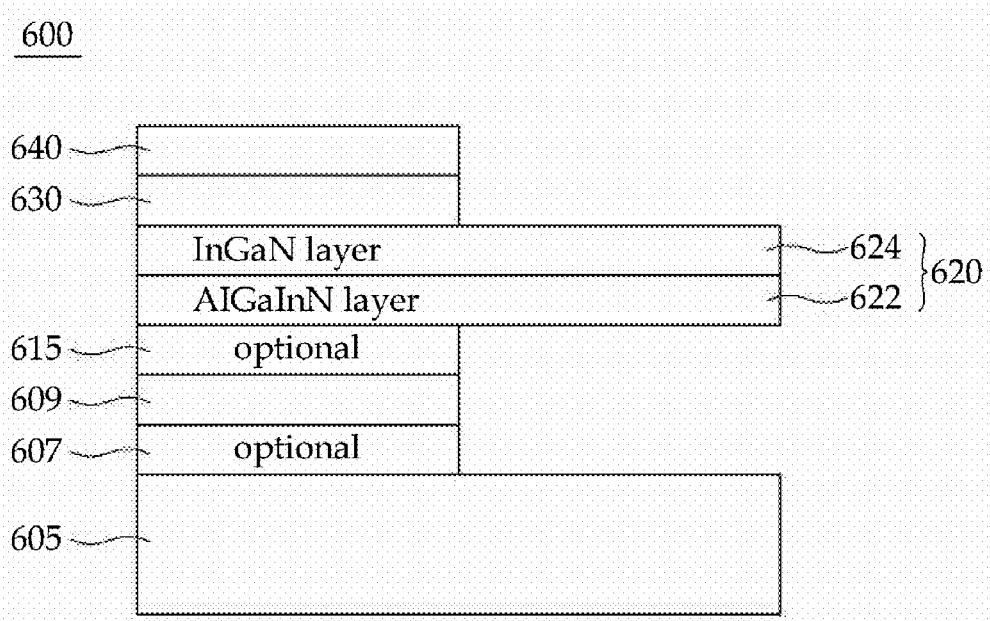
FIG. 6 is a schematic diagram of an illustrative embodiment of a III-V group semiconductor based piezoelectric actuator.
Figure 7:
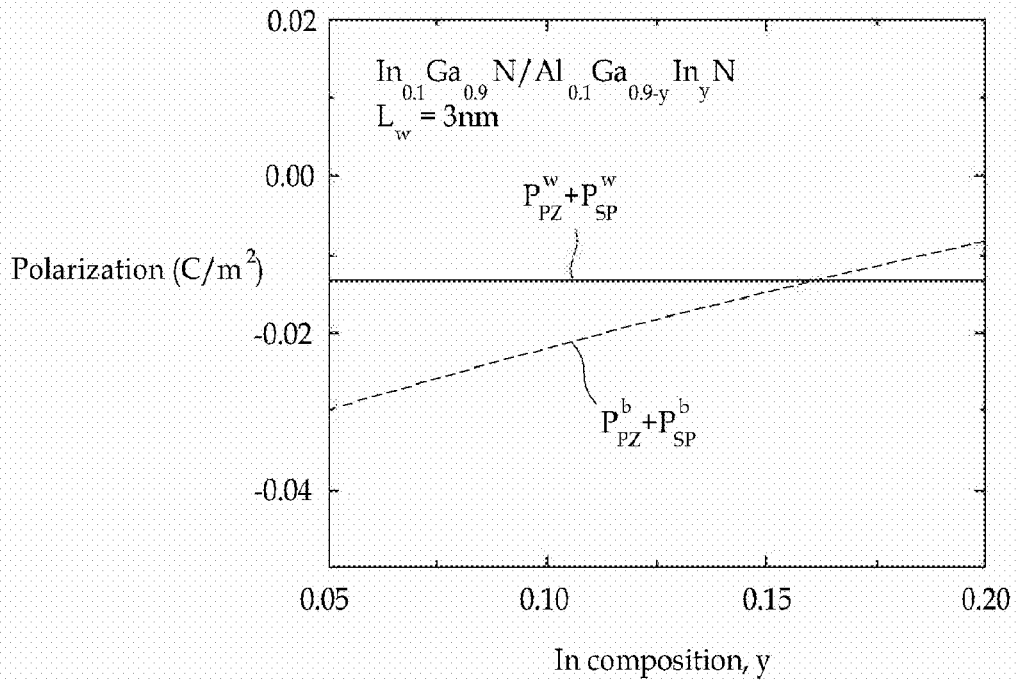
FIG. 7 is a graph showing an internal polarization field as a function of In composition of the AlGaInN lower layer shown in FIG. 6.
Figure 8:
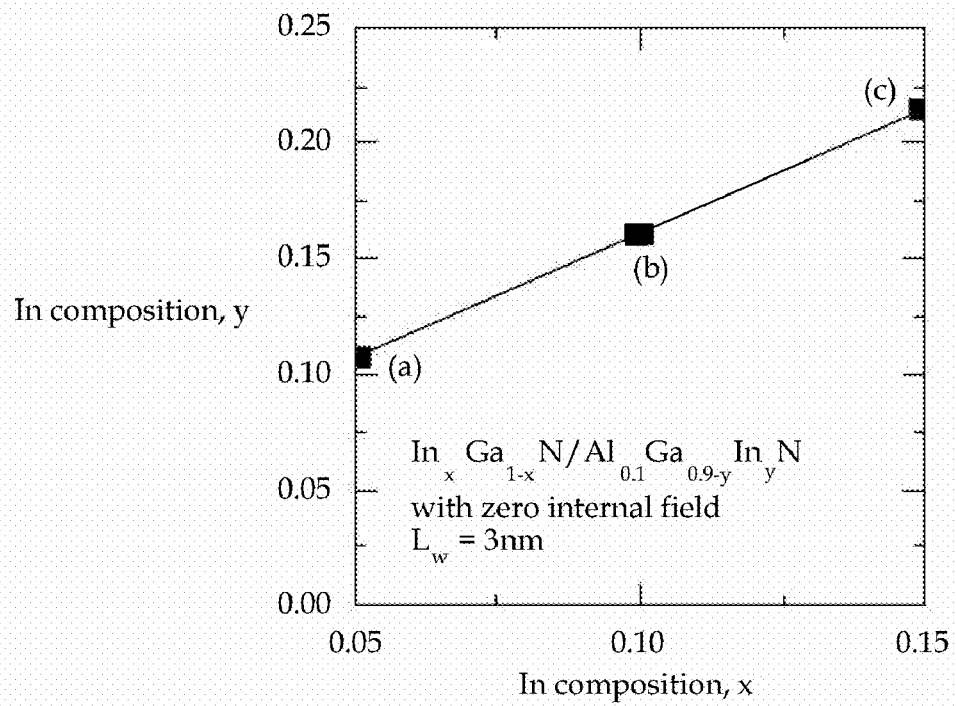
FIG. 8 is a graph showing the relationship between In composition of the InGaN upper layer and In composition of the AlGaInN lower layer shown in FIG. 6.

With reference to FIGS. 6-8, a III-V group semiconductor based piezoelectric actuator having a minimized internal polarization field will now be described in detail. FIG. 6 is a schematic diagram of an illustrative embodiment of a III-V group semiconductor based piezoelectric actuator. FIG. 7 is a graph showing an internal polarization field as a function of In composition of the AlGaInN lower layer shown in FIG. 6. FIG. 8 is a graph showing the relationship between In composition of the InGaN upper layer and In composition of the AlGaInN lower layer shown in FIG. 6.

As depicted in FIG. 6, a III-V semiconductor based actuator 600 includes a substrate 605, a sacrificial layer 607 (which is optional) disposed on substrate 605, a support layer 609 disposed on sacrificial layer 607, a strain relieving layer 615 (which is optional) disposed on support layer 609, and a piezoelectric layer 620 disposed on strain relieving layer 615. Suitable materials for substrate 605 are substantially the same as the materials described above for substrate 305. A sacrificial layer 607 may optionally be disposed between substrate 605 and support layer 609 to facilitate detachment of substrate 605 from other layers of piezoelectric actuator 600. Suitable materials for sacrificial layer 607 and support layer 609 are substantially the same as the materials described above for sacrificial layer 307 and support layer 309, respectively. A strain relieving layer 615 may optionally be disposed on support layer 609 in order to reduce strain between support layer 609 and piezoelectric layer 620. Strain relieving layer 615 can be selected to have a narrower band gap than that of piezoelectric layer 620. Strain relieving layer 615 can be composed of AlGaN, AlGaP, AlGaAs, InGaN, InGaP, InGaAs, InAlN, InAlP, InAlAs, AlGaInN, AlGaInP, or AlGaInAs. Piezoelectric layer 620 may include an AlGaInN lower layer 622 (i.e., a lower layer composed of AlGaInN) disposed on strain relieving layer 615, and an InGaN upper layer 624 (i.e., an upper layer composed of InGaN) disposed on AlGaInN lower layer 622. An insulating layer 630 and an electrode 640 may be disposed on InGaN upper layer 624. In another embodiment, another electrode may be disposed under piezoelectric layer 620 with an insulating layer disposed therebetween.

Each of AlGaInN lower layer 622 and InGaN upper layer 624 may have a thickness of several nanometers to several hundreds nanometers (nm). For example, AlGaInN lower layer 622 and InGaN upper layer 624 each have a thickness of about 0.1 nm to 300 nm, or about 1 nm to 100 nm.

As illustrated with respect to Equation (1) above, the internal polarization field in piezoelectric layer 620 can be reduced by controlling the mole fractions of the compounds in InGaN upper layer 624 and AlGaInN lower layer 622, which will now be described in detail.

The graph shown in FIG. 7 illustrates the internal polarization field (y-axis) as a function of In composition (x-axis) of AlGaInN lower layer 622. Here, InGaN upper layer 624 has the compositions of $In_{0.1}Ga_{0.9}N$ and a thickness of about 3 nm, and AlGaInN lower layer 622 has the compositions of $Al_{0.1}Ga_{0.9-y}In_yN$ and a thickness of about 3 nm to 15 nm. In composition of $Al_{0.1}Ga_{0.9-y}In_yN$ (variable y) may be controlled such that the sum $P_{PZ}^u + P_{SP}^u$ of the piezoelectric and spontaneous polarizations in InGaN upper layer 624 and the sum $P_{PZ}^l + P_{SP}^l$ of the piezoelectric and spontaneous polarizations in AlGaInN lower layer 622 are substantially the same. The cancellation of the sum of piezoelectric and spontaneous polarizations between InGaN upper layer 624 and AlGaInN lower layer 622 make a total internal polarization field (e.g., internal polarization field $F_z^u$) in InGaN upper layer 624 zero as defined in Equation (1).

As depicted in FIG. 7, the solid line indicates the sum $P_{PZ}^u + P_{SP}^u$ in InGaN upper layer 624 and the dotted or dashed line indicates the sum $P_{PZ}^l + P_{SP}^l$ in AlGaInN lower layer 622. An experimental test showed that the solid line meets the dotted line where the variable y is approximately 016. Because the sum $P_{PZ}^u + P_{SP}^u$ and the sum $P_{PZ}^l + P_{SP}^l$ are substantially the same at the point where the solid and dotted lines meet, the internal polarization field in InGaN upper layer 624 becomes approximately zero according to Equation (1). Accordingly, when variable y is approximately 0.16, that is, AlGaInN lower layer 622 has the composition of $Al_{0.1}Ga_{0.74}In_{0.16}N$, the internal polarization field becomes approximately zero.

In composition of InGaN upper layer 624 and AlGaInN lower layer 622 can be controlled. The graph shown in FIG. 8 illustrates the relationship between In compositions of InGaN upper layer 624 and In compositions of AlGaInN lower layer 622 when the internal polarization field is zero. Through the experiments, the mole fractions of the compounds in InGaN upper layer 624 and AlGaInN lower layer 622, in which the internal polarization field can be zero, can be determined.

For example, the mole fractions of In and Ga compositions of $In_xGa_{1-x}N$ ($0 \leq x \leq 1$) upper layer 624 can be controlled, while controlling the mole fractions of Ga and In compositions of $Al_{0.1}Ga_{0.9-y}In_yN$ ($0 \leq y \leq 0.9$) lower layer 622. Here $In_xGa_{1-x}N$ upper layer 624 has a thickness of about 3 nm and $Al_{0.1}Ga_{0.9-y}In_yN$ lower layer 622 has a thickness of about 3 nm to 15 nm. As shown in the graph of FIG. 8, the internal polarization field can be approximately zero when In compositions (variable x and y) in $In_xGa_{1-x}N$ upper layer 624 and $Al_{0.1}Ga_{0.9-y}In_yN$ lower layer 622 are approximately 0.05 and 0.11 respectively (black square (a) on the linear line). In this case, $In_xGa_{1-x}N$ upper layer 624 has the composition of $In_{0.05}Ga_{0.95}N$ and $Al_{0.1}Ga_{0.9-y}In_yN$ lower layer 622 has the composition of $Al_{0.1}Ga_{0.79}In_{0.11}N$. Further, at the black square (b) on the linear line (that is, x and y are 0.1 and 0.16, respectively), piezoelectric actuator 600 has $In_{0.1}Ga_{0.9}N$ upper layer 624 and $Al_{0.1}Ga_{0.74}In_{0.16}N$ lower layer 622, and the internal polarization field becomes approximately zero. Still further, at the black square (c) on the linear line (that is, x and y are approximately 0.15 and 0.21, respectively), piezoelectric actuator 600 has $In_{0.15}Ga_{0.85}N$ upper layer 624 and $Al_{0.1}Ga_{0.69}In_{0.21}N$ lower layer 622, and the internal polarization field becomes zero.

Accordingly, by using the linear line of the zero internal polarization field as shown in FIG. 8, In composition (y) of AlGaInN lower layer 622 and/or In composition (x) of InGaN upper layer 624 can be selected. In some embodiments, In composition (x) of $In_xGa_{1-x}N$ upper layer 624 can be in the range of about zero (0) and 0.3, and In composition (y) of $Al_{0.1}Ga_{0.9-y}In_yN$ lower layer 622 can be in the range of about 0.01 and 0.3. In other embodiments, In composition (x) of $In_xGa_{1-x}N$ upper layer 624 can be in the range of about 0.05 and 0.15, and In composition (y) of $Al_{0.1}Ga_{0.9-y}In_yN$ lower layer 622 can be in the range of about 0.1 and 0.22.

As shown in the graph of FIG. 8, In compositions of $In_xGa_{1-x}N$ upper layer 624 and $Al_{0.1}Ga_{0.9-y}In_yN$ lower layer 622 (the variables x and y) can have a linear relationship. In some embodiments, the relationship between III-V group compound semiconductor materials of an upper layer and a lower layer can show a non-linear relationship, such as logarithmic or exponential relationship in accordance with the type of the III-V group compound semiconductor materials of the upper and lower layers, and the variety of compositions of the III-V group compound semiconductor materials.

In some embodiment, In compositions of InGaN upper layer 624 and AlGaInN lower layer 622 can be selected based on the amount of the compressive strain in a layer. Since the higher In composition (e.g., about 0.3 or more) of InGaN upper layer 624 results in larger compressive strain, and the growth of the strained layers is limited to a critical thickness, the lower In composition (e.g., about 0.01 to 0.3) of AlGaInN lower layer 622 can be selected.

As described above, through the composition control of InGaN upper layer 624 and AlGaInN lower layer 622 of piezoelectric layer 620, the internal polarization field of piezoelectric layer 620 can be effectively reduced. Further, the minimization of the internal polarization field allows piezoelectric actuator 600 to vibrate in response only to the electric or magnetic field surrounding piezoelectric actuator 600, not to the undesired internal polarization field generated in the heterostructure of piezoelectric layer 620. Thus, the sensibility of piezoelectric actuator 600 can be enhanced.

Figure 9:
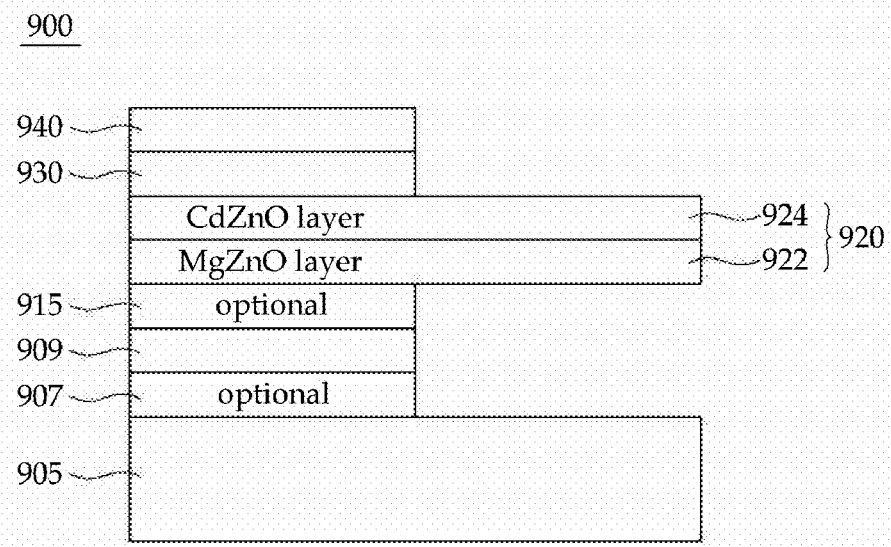
FIG. 9 is a schematic diagram of an illustrative embodiment of a II-VI group semiconductor based piezoelectric actuator.
Figure 10:
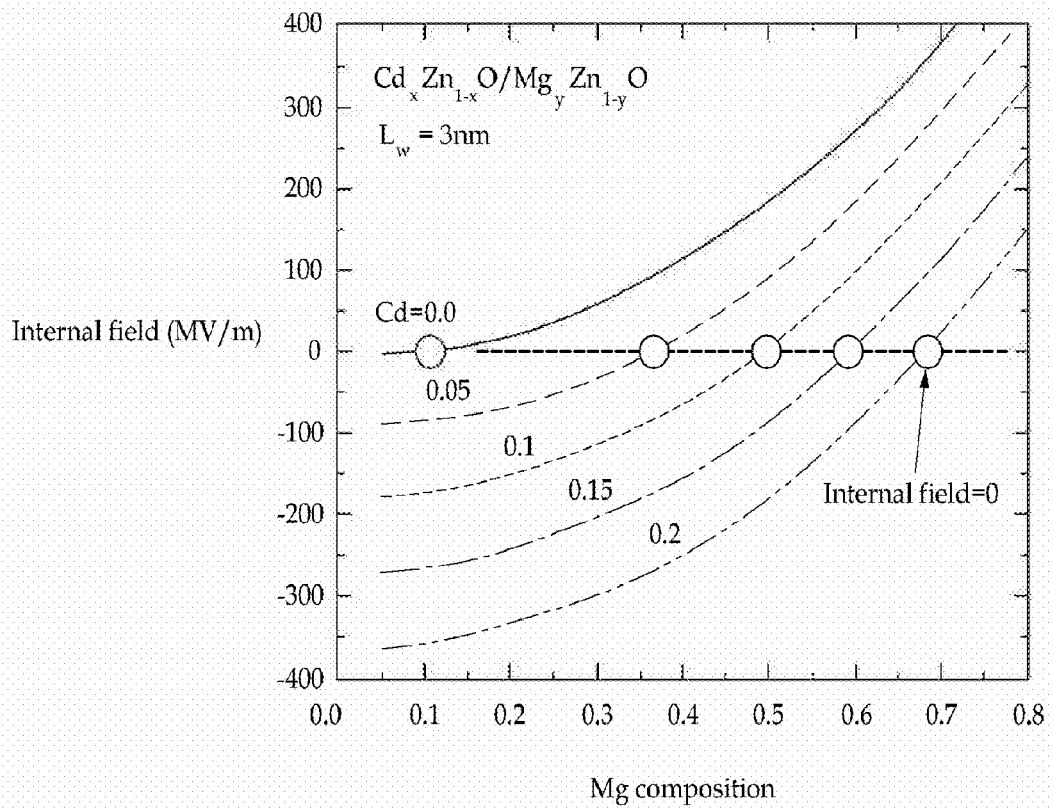
FIG. 10 is a graph showing an internal polarization field as a function of Mg composition of the MgZnO lower layer shown in FIG. 9.
Figure 11:
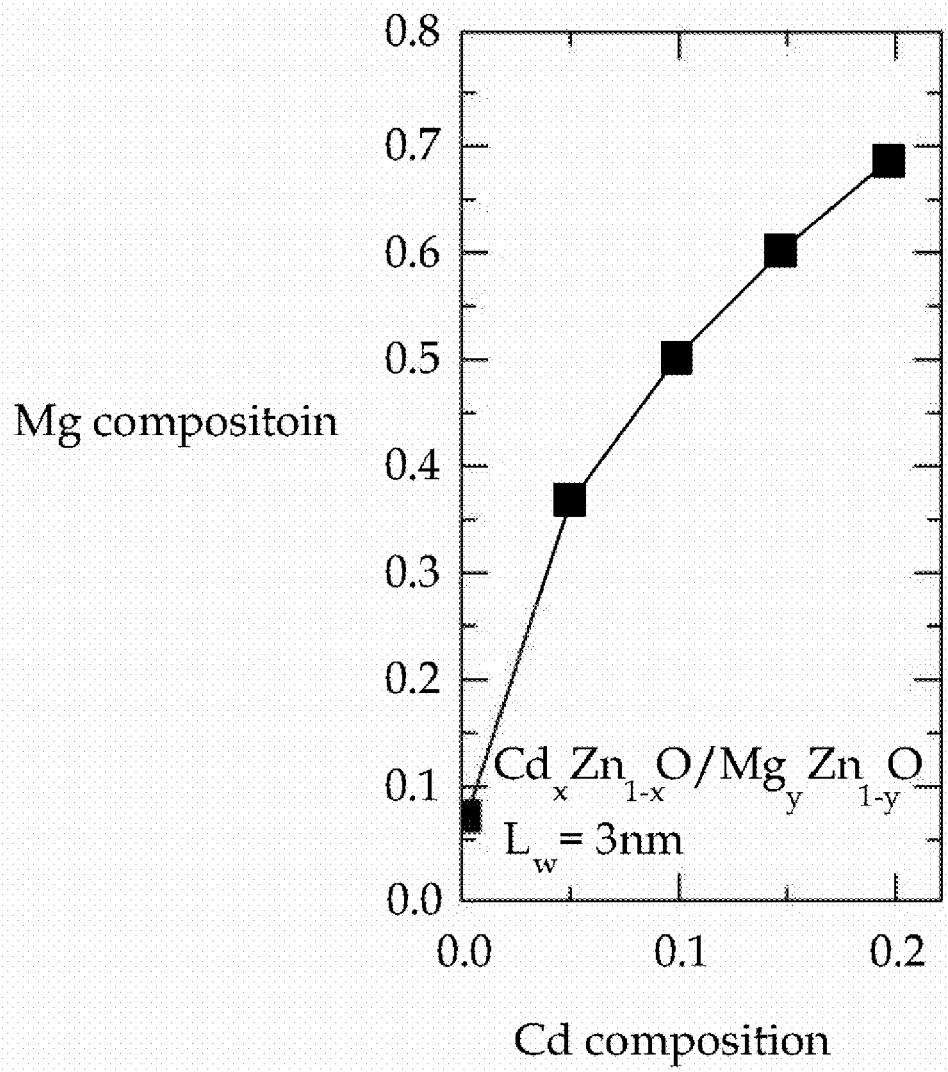
FIG. 11 is a graph showing the relationship between Mg composition of the MgZnO lower layer and Cd composition of the CdZnO upper layer shown in FIG. 9.

In another embodiment, a piezoelectric actuator may have a II-VI group compound semiconductor material for the upper and lower semiconductor layers. Such a II-VI group semiconductor based actuator will now be described with reference to FIGS. 9-11. FIG. 9 is a schematic diagram of an illustrative embodiment of a II-VI group semiconductor based piezoelectric actuator. FIG. 10 is a graph showing an internal polarization field as a function of Mg composition of the MgZnO lower layer shown in FIG. 9. FIG. 11 is a graph showing the relationship between Mg composition the of MgZnO lower layer and Cd composition of the CdZnO upper layer shown in FIG. 9.

As depicted in FIG. 9, a II-VI group semiconductor based actuator 900 includes a substrate 905, a sacrificial layer 907 (which is optional) disposed on substrate 905, a support layer 909 disposed on sacrificial layer 907, a strain relieving layer 915 (which is optional) disposed on support layer 909, and a piezoelectric layer 920 disposed on strain relieving layer 915. Suitable materials for substrate 905 are substantially the same as the materials described above for substrate 305. Sacrificial layer 907 may optionally be disposed between substrate 905 and support layer 909 to facilitate detachment of substrate 905 from other layers of piezoelectric actuator 900. Suitable materials for sacrificial layer 907 and support layer 909 are substantially the same as the materials described above for sacrificial layer 307 and support layer 309, respectively. Strain relieving layer 915 may optionally be disposed on support layer 909 in order to reduce strain between support layer 909 and piezoelectric layer 920. Strain relieving layer 915 can be selected to have a narrower band gap than that of piezoelectric layer 920. Strain relieving layer 915 can be composed of CdZnS, CdZnO, MgZnO, MgZnS, CdMgZnO, or CdMgZnS.

Piezoelectric layer 920 may include an CdZnO upper layer 924 (i.e., an upper layer composed of CdZnO) and a MgZnO lower layer 922 (i.e., a lower layer composed of MgZnO). Upper and lower semiconductor layers 924 and 922 form a heterostructure. An insulating layer 930 and an electrode 940 may be disposed on CdZnO upper layer 924. In other embodiments, another electrode may be disposed under support layer 909.

CdZnO upper layer 924 and MgZnO lower layer 922 may each have a thickness of several nanometers to several hundreds nanometers. For example, each of CdZnO upper layer 924 and MgZnO lower layer 922 has a thickness of about 0.1 nm to 300 nm, or about 1 nm to 100 nm.

As described above, due to lattice dismatch between CdZnO upper layer 924 and MgZnO lower layer 922, a piezoelectric field can be generated from the heterostructure of piezoelectric actuator 900 and a total internal polarization field can be increased. The total internal polarization field can be vanished by controlling the mole fractions of the compounds in CdZnO upper layer 924 and MgZnO lower layer 922.

According to Equation (1), the internal polarization field in piezoelectric layer 920 can be reduced by controlling the mole fractions of the compounds in CdZnO upper layer 924 and MgZnO lower layer 922, as shown in the graph of FIG. 10. The graph shown in FIG. 10 illustrates the internal polarization field (y-axis) in CdZnO upper layer 924 for different Cd compositions of CdZnO upper layer 924 and Mg compositions of MgZnO lower layer 922 (x-axis). Here, CdZnO upper layer 924 is assumed to have the composition of $Cd_xZn_{1-x}O$ ($0 \leq x \leq 1$) and has a thickness of about 3 nm, and MgZnO lower layer 922 has the composition of $Mg_yZn_{1-y}O$ ($0 \leq y \leq 1$) and has a thickness of about 3 nm to 15 nm.

As described above, the compositions of $Cd_xZn_{1-x}O$ upper layer 924 and $Mg_yZn_{1-y}O$ lower layer 922 may be controlled to make the internal polarization field in $Cd_xZn_{1-x}O$ upper layer 924 approximately zero. As an example, when Cd composition of $Cd_xZn_{1-x}O$ upper layer 924 and Mg composition of $Mg_yZn_{1-y}O$ lower layer 922 are approximately zero and 0.1, respectively (that is, piezoelectric actuator 900 has the upper/lower layers of ZnO upper layer/$Mg_{0.1}Zn_{0.9}O$ lower layer), the internal polarization field becomes approximately zero. As another example, the internal polarization field becomes approximately zero when the variables x and y are approximately 0.05 and 0.37, 0.1 and 0.5, 0.15 and 0.6, and 0.2 and 0.7, respectively. In the case where the variables x and y are 0.2 and 0.7, respectively, piezoelectric actuator 900 has the upper/lower layers of $Cd_{0.2}Zn_{0.8}O$ upper layer/$Mg_{0.7}Zn_{0.3}O$ lower layer. When Cd composition (x) of $Cd_xZn_{1-y}O$ upper layer 924 is in the range of about zero (0) and 0.2, Mg composition (y) of $Mg_yZn_{1-y}O$ lower layer 922 can be in the range of about 0.01 and 0.8.

The relationship between Mg and Cd compositions is illustrated in the graph of FIG. 11. In the graph, the solid line indicates when the internal polarization is zero. As shown in the graph, Mg composition of $Mg_yZn_{1-y}O$ lower layer 922 can increase logarithmically in accordance with the increase of Cd composition of $Cd_xZn_{1-x}O$ upper layer 924 in the condition of zero internal polarization field In this case, Mg composition of $Mg_yZn_{1-y}O$ lower layer 922 and Cd composition of $Cd_xZn_{1-x}O$ upper layer 924 are in a logarithmic relationship. In some embodiments, the relationship between II-VI group compound semiconductor materials of an upper layer and a lower layer can show a linear or a non-linear relationship, such as an exponential relationship in accordance with the type of the II-VI group compound semiconductor materials of the upper and lower layers, and the variety of compositions of the II-VI group compound semiconductor materials As described with respect to the III-V group semiconductor based actuator above, Cd and Zn compositions of CdZnO upper layer 924 and the Mg and Zn compositions of MgZnO lower layer 922 may be controlled to reduce the internal polarization field of piezoelectric layer 920. Further, the minimization of the internal polarization field allows piezoelectric actuator 900 to vibrate in response only to the electric or magnetic field surrounding piezoelectric actuator 900, not to the undesired internal polarization field generated in the heterostructure of piezoelectric layer 920. Thus, the sensibility of piezoelectric actuator 900 can be enhanced.

In another embodiment, I-VII group compound semiconductor materials can be used for a piezoelectric layer of a I-VII group compound semiconductor based piezoelectric actuator. For example, each of the upper and lower layers of the piezoelectric layer can be selected from CuF, CuBr, CuCl, CuI, CuFBr, CuFCl, CuFI, CuBrCl, CuBrI, CuChI, CuFBrCl, CuFBrI, CuFClI, CuBrClI, AuF, AuBr, AuCl, AuI, AuFBr, AuFCl, AuFI, AuBrCl, AuBrI, AuClI, AuFBrCl, AuFBrI, AuFClI, AuBrClI, AgF, AgBr, AgCl, AgI, AgFBr, AgFCl, AgFI, AgBrCl, AgBrI, AgClI, AgFBrCl, AgFBrI, AgFClI, or AkgBrClI to form a heterostructure. The lower layer of the piezoelectric layer can be a ternary or a quaternary compound material. In some example, at least one of the composition of the lower layer and the composition of the upper layer can be controlled to reduce the internal polarization field in a similar manner as described with respect to the III-V group compound semiconductor based actuator and the II-VI group compound semiconductor based actuator above.

A method for fabricating a piezoelectric actuator will now be described. FIGS. 12(a)-12(f) are schematic diagrams showing an illustrative embodiment of a method for fabricating a piezoelectric actuator.

Figure 12A:
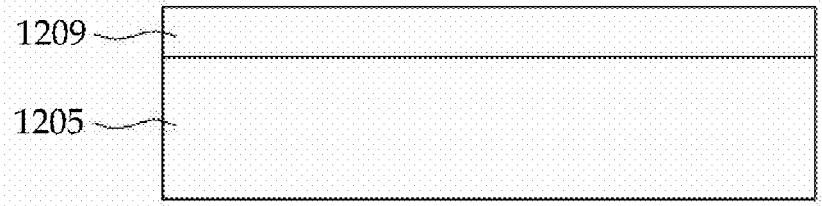
FIGS. 12($a$)-12($f$) are schematic diagrams showing an illustrative embodiment of a method for fabricating a piezoelectric actuator.

As depicted in FIG. 12(a), a support layer 1209 is formed on a substrate 1205. Suitable materials for substrate 1205 and support layer 1209 are substantially the same as the materials described above for substrate 305 and support layer 309, respectively. Support layer 1209 may provide an appropriate crystalline transition between substrate 1205 and other layers to be formed on support layer 1209. Support layer 1209 can be formed using any of a variety of well known deposition techniques or epitaxy techniques, such as radio-frequency (RF) magnetron sputtering, pulsed laser deposition, metal organic chemical vapor deposition (MOCVD), molecular beam epitaxy or radio-frequency plasma-excited molecular beam epitaxy.

Figure 12B:
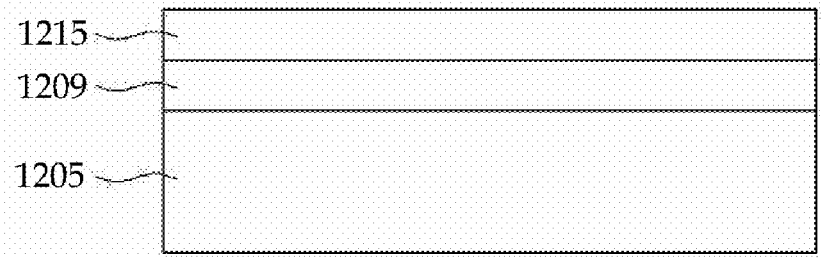
Figure 12C:
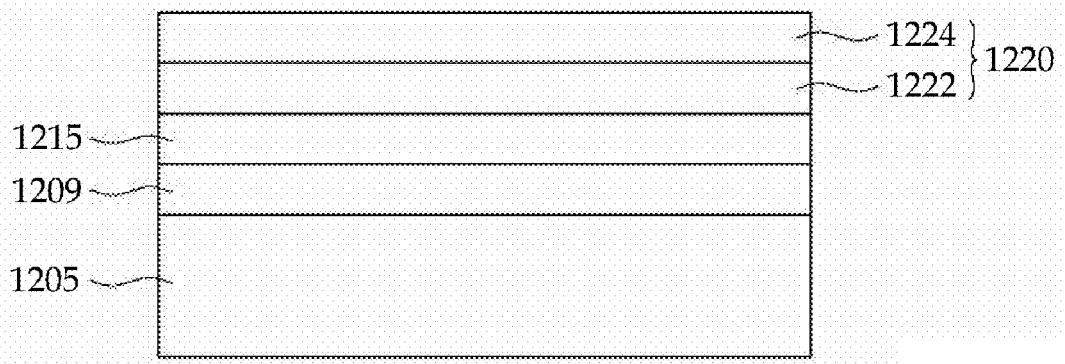

Then, as depicted in FIG. 12(b), a strain relieving layer 1215 may be formed on support layer 1209 in order to reduce strain between support layer 1209, and a piezoelectric layer 1220 (FIG. 12(c)) to be formed on strain relieving layer 1215. Strain relieving layer 1215 can be selected to have a narrower band gap than that of piezoelectric layer 1220. Suitable materials for strain relieving layer 1215 are substantially the same as the materials described above for strain relieving layer 115. Strain relieving layer 1215 may be formed using any of the aforementioned well known deposition techniques or epitaxy techniques.

As depicted in FIG. 12(c), piezoelectric layer 1220 can be formed by sequentially depositing a lower semiconductor layer 1222 on strain relieving layer 1215 and an upper semiconductor layer 1224 on lower semiconductor layer 1222. A compound semiconductor material for lower semiconductor layer 1222 may have a wider band gap than a compound semiconductor material for upper semiconductor layer 1224. Suitable materials for lower and upper semiconductor layers 1222 and 1224 are substantially the same as the materials described above for lower and upper semiconductor layer 122 and 124. The compositions of lower and upper semiconductor layers 1222 and 1224 can be adjusted by controlling the amount of precursor gases provided to a deposition device (e.g. MOCVD device) or by controlling the processing temperature or processing time.

Figure 12D:
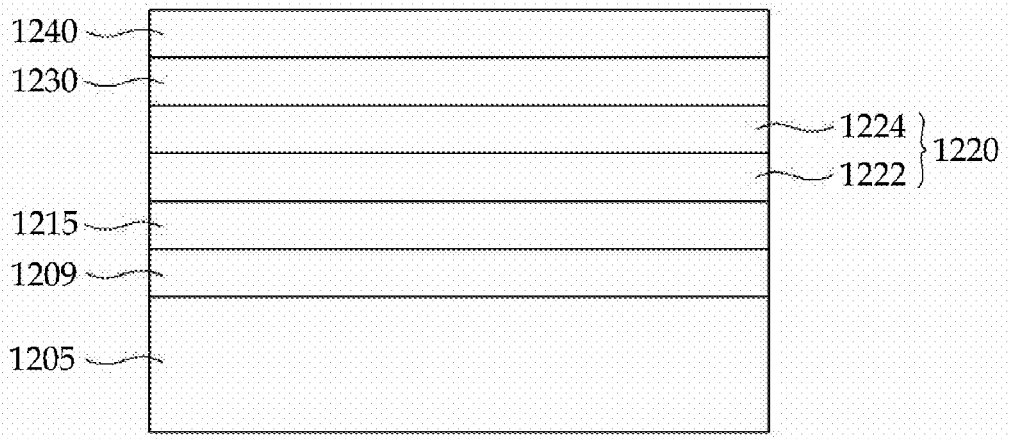

As depicted in FIG. 12(d), an insulating layer 1230 and a conductive layer 1240 are sequentially formed on piezoelectric layer 1220. Insulating layer 1230 is formed of, without limitation, silicon oxide, silicon nitride, a III-V group compound semiconductor material, such as gallium nitride or aluminum gallium nitride, or a II-V group compound semiconductor material, such as ZnO or MgZnO, by using any of a variety of well known deposition and epitaxy techniques, such as low pressure or plasma-enhanced chemical vapor deposition (LPCVD or PECVD), radio-frequency (RF) magnetron sputtering, pulsed laser deposition, metal organic chemical vapor deposition (MOCVD), molecular beam epitaxy and radio-frequency plasma-excited molecular beam epitaxy. Conductive layer 1240 is formed of, without limitation, titanium (Ti), aluminum (Al), nickel (Ni), aurum (Au), or alloys thereof, by any of a variety of well known techniques, such as sputtering, electroplating, e-beam evaporation, thermal evaporation, laser-induced evaporation, or ion-beam induced evaporation.

Figure 12E:
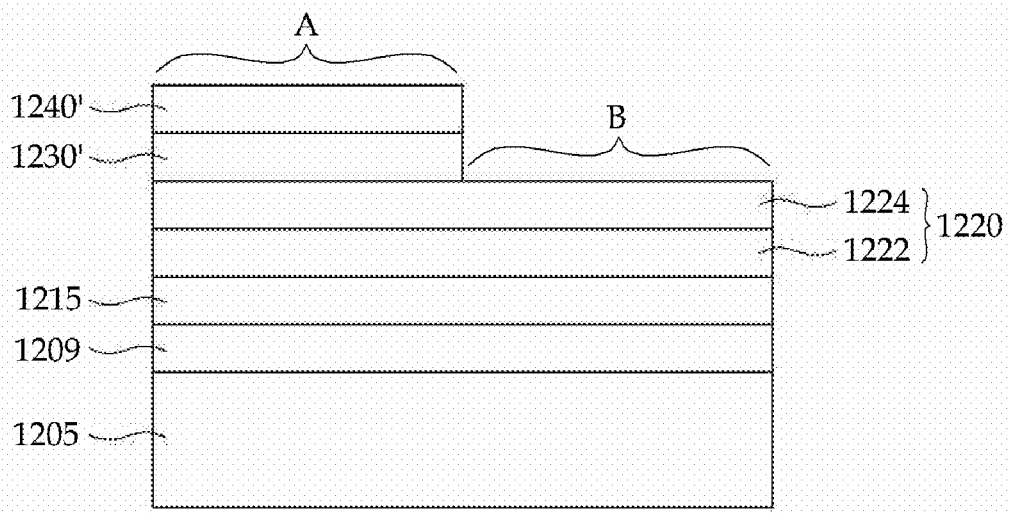
Figure 12F:
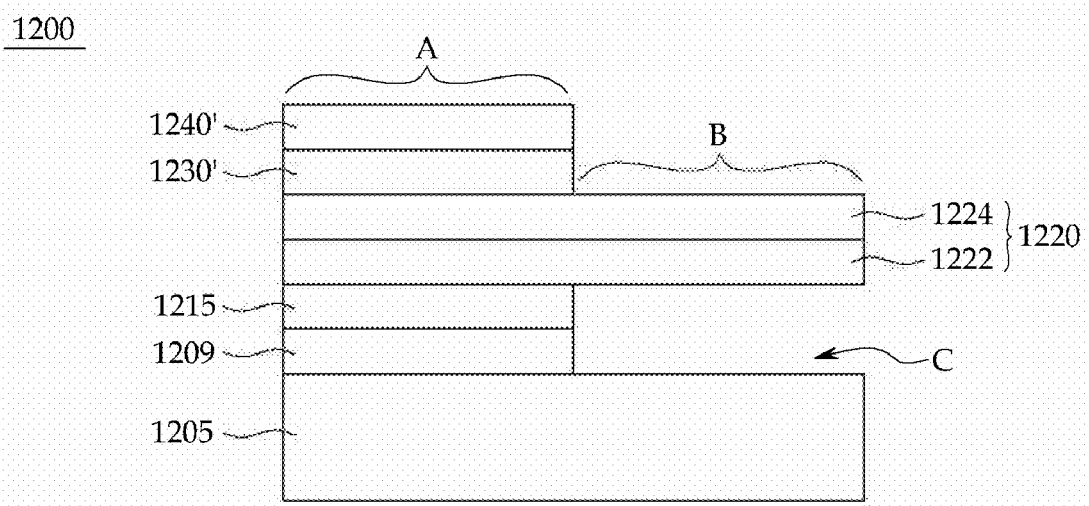

As depicted in FIG. 12(e), a part of conductive layer 1240 is removed to expose a part of insulating layer 1230 by using any of a variety of well known lithographys and etching techniques. For example, a photoresist (not shown) is formed on conductive layer 1240. The photoresist is prebaked, and light is selectively applied on the photoresist to define a region for etching on conductive layer 1240. Then, the photoresist is developed to form a photomask over conductive layer 1240 to define a protected area and an unprotected area. The unprotected area of conductive layer 1240 is subsequently etched to form an electrode 1240', thereby exposing a part of insulating layer 1230. Then, the photomask is stripped so that further processing can take place. The exposed part of Insulating layer 1230 is etched to expose a part of piezoelectric layer 1220. Here, the exposed part of piezoelectric layer 1220 is denoted as cantilever portion "B" and the residual portion of insulating layer 1230 as a result of etching is denoted as a patterned insulating layer 1230'.

As shown in FIG. 12(*f*), support layer 1209 and strain relieving layer 1215 are selectively etched to undercut piezoelectric layer 1220. This etching leaves cavity "C" under cantilever portion "B" of piezoelectric layer 1220. Accordingly, as shown in FIG. 12(*f*), piezoelectric layer 1220 has a supported portion "A" supported by support layer 1209 and cantilever portion "B" that extends over support layer 1209. In another embodiment, substrate 1205 can be removed from a piezoelectric actuator 1200. Then, support layer 1209 and strain relieving layer 1215 can sequentially etched in part to expose cantilever portion "B" of piezoelectric layer 1220. After removing substrate 1205 from piezoelectric actuator 1200, support layer 1209 can be removed and then an insulating layer and lower electrode can be formed on strain relieving layer 315 (not shown).

In some embodiments, piezoelectric actuators (e.g., piezoelectric actuators 100, 300, 400, 600, 900, and 1200) can be used for piezoelectric buzzers, inkjet buzzers, inkjet heads of printers, or ultrasonic motors. In some embodiments, the piezoelectric actuators can be adopted in a microelectromechanical system (MEMS), a micro system technique (MST), or a sensor, such as a biosensor, a chemical sensor, a magnetic sensor, or an accelerometer.

For example, the sensor may include a support layer, a piezoelectric layer having a supported portion formed on the support layer and a cantilever portion which extends beyond the support layer, and at least one of an upper electrode disposed on one side of the piezoelectric layer and a lower electrode disposed on the other side of the piezoelectric layer. The piezoelectric layer can include a lower semiconductor layer and an upper semiconductor layer formed on the lower semiconductor layer, where a portion of the lower and upper semiconductor layers form the supported portion, and another portion of the lower and upper semiconductor layers form the cantilever portion. The composition of at least one of the lower and upper semiconductor layers is adjusted to reduce an internal polarization field in the piezoelectric layer. The sensor may optionally include a strain relieving layer that is in contact with the piezoelectric layer. Because the piezoelectric actuator incorporated in the sensor responds to an electric field applied to the actuator or a magnetic field surrounding the actuator, rather than the internally generated field, the sensor can accurately detect the existence of any electrical signal applied to the sensor. Accordingly, by removing the internal polarization field in the heterostructure of the piezoelectric layer, the sensibility of the sensor will be significantly enhanced.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary, It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g. "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g. "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g. "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

The invention claimed is:

1. An actuator comprising:
   a support layer; and
   a piezoelectric layer comprising a lower semiconductor layer and an upper semiconductor layer formed on the lower semiconductor layer, a portion of the lower and upper semiconductor layers being a supported portion formed on the support layer, and another portion of the lower and upper semiconductor layers being a cantilever portion which extends beyond the support layer; and
   a strain relieving layer in contact with the piezoelectric layer, wherein the strain relieving layer is composed of AlGaInN, InGaN, AlGaN, AlGaP, AlGaAs, InGaN, InGaP, InGaAs, InAlN, InAlP, InAlAs, AlGaInP, AlGaInAs, CdZnS, CdZnO, MgZnS, MgZnO, CdMgZnO, CdMgZnS, CuFBr, CuFCl, CuFI, CuBrCl, CuBrI, CuClI, CuFBrCl, CuFBrI, CuFClI, CuBrClI, AuFBr, AuFCl, AuFI, AuBrCl, AuBrI, AuClI, AuFBrCl, AuFBrI, AuFClI, AuBrClI, AgFBr, AgFCl, AgFI, AgBrCl, AgBrI, AgClI, AgFBrCl, AuFBrI, AgFClI, or AgBrClI.

2. The actuator of claim 1, further comprising one or more electrodes disposed on either side of the piezoelectric layer or both sides of the piezoelectric layer.

3. The actuator of claim 1, wherein the lower and upper semiconductor layers form a heterostructure.

4. The actuator of claim 1, wherein each of the lower and upper semiconductor layers is composed of a III-V group compound semiconductor material, a II-VI group compound semiconductor material, or a I-VII group compound semiconductor material.

5. The actuator of claim 1, wherein each of the lower and upper semiconductor layers is selected from GaN, InGaN, AlN, AlP, AlAs, GaP, GaAs, InN, InP, InAs, AlGaN, AlGaP, AlGaAs, InGaN, InGaP, InGaAs, InAlN, InAlP, InAlAs, AlGaInN, AlGaInP, AlGaInAs, ZnO, ZnS, CdO, CdS, CdZnS, CdZnO, MgZnO, MgZnS, CdMgZnO, CdMgZnS, CuF, CuBr, CuCl, CuI, CuFBr, CuFCl, CuFI, CuBrCl, CuBrI, CuClI, CuFBrCl, CuFBrI, CuFClI, CuBrClI, AuF, AuBr, AuCl, AuI, AuFBr, AuFCl, AuFI, AuBrCl, AuBrI, AuClI, AuFBrCl, AuFBrI, AuFClI, AuBrClI, AgF, AgBr, AgCl, AgI, AgFBr, AgFCl, AgFI, AgBrCl, AgBrI, AgClI, AgFBrCl, AgFBrI, AgFClI, or AgBrClI.

6. The actuator of claim 1, wherein the upper semiconductor layer is composed of $Cd_xZn_{1-x}O$ ($0 \leq x \leq 1$), and the lower semiconductor layer is composed of $Mg_yZn_{1-y}O$ ($0 \leq y \leq 1$).

7. The actuator of claim 6, wherein x is in the range of about 0 and 0.20, and y is in the range of about 0.01 and 0.80.

8. The actuator of claim 1, wherein each of the upper and lower semiconductor layers has a thickness in the range of about 0.1 nm and 300 nm.

9. The actuator of claim 1, wherein the piezoelectric layer is deflectable as a result of an applied electric or magnetic field.

10. The actuator of claim 1, wherein the actuator is implemented in a sensor.

11. An actuator comprising:
    a support layer; and
    a piezoelectric layer comprising a lower semiconductor layer and an upper semiconductor layer formed on the lower semiconductor layer, a portion of the lower and upper semiconductor layers being a supported portion formed on the support layer, and another portion of the lower and upper semiconductor layers being a cantilever portion which extends beyond the support layer, wherein the upper semiconductor layer is composed of $In_xGa_{1-x}N$ ($0 \leq x \leq 1$), and the lower semiconductor layer is composed of $AlGa_{1-y}In_yN$ ($0 \leq y \leq 1$).

12. The actuator of claim 11, wherein x is in the range of about 0 and 0.30, and y is in the range of about 0.01 and 0.30.

* * * * *